United States Patent [19]

Tsunemitsu

[11] 4,001,871
[45] Jan. 4, 1977

[54] SEMICONDUCTOR DEVICE

[75] Inventor: Hideo Tsunemitsu, Tokyo, Japan

[73] Assignee: Nippon Electric Company, Limited, Tokyo, Japan

[22] Filed: Oct. 16, 1974

[21] Appl. No.: 515,228

Related U.S. Application Data

[62] Division of Ser. No. 833,095, June 13, 1969, Pat. No. 3,988,214.

[30] Foreign Application Priority Data

| June 17, 1968 | Japan | 43-41769 |
| Dec. 28, 1968 | Japan | 44-925 |

[52] U.S. Cl. .................. 357/54; 357/72; 357/73; 29/577; 204/15

[51] Int. Cl.² .................. H01L 29/34; H01L 23/28; H01L 23/30; C25D 5/02

[58] Field of Search ............. 204/15; 357/54, 72, 357/73; 29/577

[56] References Cited

UNITED STATES PATENTS

| 3,169,892 | 2/1965 | Lemelson | 357/54 |
| 3,320,484 | 5/1967 | Riley et al. | 357/54 |
| 3,351,825 | 11/1967 | Vidas | 357/54 |
| 3,634,203 | 1/1972 | Richardson | 204/15 |

*Primary Examiner*—Andrew T. James
*Attorney, Agent, or Firm*—Hopgood, Calimafde, Kalil, Blaustein & Lieberman

[57] ABSTRACT

An integrated circuit device with multi-level interconnection wiring structure built upon the substrate wherein each level is formed of conductor and insulator portions and wherein each level has a surface substantially parallel to the surface of the substrate.

13 Claims, 22 Drawing Figures

SEMICONDUCTOR DEVICE

This is a division of application Ser. No. 833,095, filed June 13, 1969, now U.S. Pat. No. 3,988,214.

This invention relates to a semiconductor device having a substantially flat surface and, more specifically, to a semiconductor integrated circuit device having multi-level interconnection structure.

BACKGROUND OF THE INVENTION

Semiconductor devices have been developed to afford a higher degree of reliability and integration. It is desirable that these highly integrated circuit devices have multi-level interconnection structure on the surface of the semiconductor substrate to provide lead-out wirings to each of the semiconductor regions in the substrate.

The lead-out wirings for conventional semiconductor devices are formed by selective photo-etching of a thin metal film formed by sputtering or vacuum evaporation of metal over the semiconductor substrate. However, on the surface of the substrate, a certain degree of unevenness is unavoidable in lead-out wiring formed in that manner. Furthermore, since an overlying wiring layer is juxtaposed with an uneven underlying wiring layer, the problem of unevenness is worsened as layers are laminated and multi-level interconnections are formed.

Additionally, it is known in the art that when the metal film forming the wiring is deposited on the substrate surface, the thickness of the metal film is often insufficient at the end portions of the wiring. Moreover, the end portions of the wiring are particularly vulnerable to selective etching. As a result, the wirings may become defective and hence the reliability. Thus, with the conventional technique of selective etching, it is almost impossible to provide a highly reliable integrated circuit device, especially one having multi-level interconnection structure.

OBJECT OF THE INVENTION

It is, therefore, the principal object of this invention to provide a semiconductor device having highly reliable interconnection structure.

Another object of the invention is to provide a semiconductor device in which the conductive layers for wiring are formed without resorting to a selective photo-etching process.

Still another object of this invention is to provide a semi-conductor integrated circuit device having multi-level interconnection structure of the high reliability in which each of wiring layers and insulator layers is made substantially flat to avoid the above-mentioned irregularities and unevenness.

A further object of this invention is to provide an improved and simplified method of manufacturing a highly reliable semiconductor integrated circuit device.

SUMMARY OF THE INVENTION

According to this invention, there is provided a semiconductor device which comprises a semiconductor substrate having a necessary number of circuit components therein and at least one layer of wiring structure. The wiring structure or wiring layer comprises electrodes or lead-out wirings together with insulator material chemically changeable to the material of the electrodes. More specifically, the wiring layer is formed by uniformly depositing a sheet material of one electrical property (conductive) on the substrate surface and selectively changing the material to give another property (insulative).

Also, according to the present invention, a semiconductor device is produced which comprises a first conductive layer formed on the semiconductor substrate, and an insulator layer which covers the first layer and has a surface substantially parallel to that of the substrate and substantially flat, and a second layer of conductor wirings formed on the surface of the first insulator layer. This structure may have additional conductor wiring layers and insulator layers.

Furthermore, in accordance with the invention, a semiconductor device is provided in which the surface of each of the wiring layers is made substantially flat by coating the semiconductor substrate with a film of conductive or insulating material of uniform thickness, subjecting to anode oxidation those portions of the conductive material which do not correspond to the wirings to be formed, while subjecting to reduction those portions of insulating material which correspond to the wirings.

The semiconductor devices of this invention are thus free from selective etching in the formation of metallic wirings, making it possible to provide flatter and smoother wirings an the semiconductor substrate.

Experiments have indicated that substances suited for deposition on the semiconductor substrate include anodizable metals such as aluminum, tantalum, titanium, niobium, and hafnium.

To facilitate understanding of the features and the objects of the present invention, the detailed description of the invention will be made in conjunction with the accompanying drawings, in which:

BRIEF DESCRIPTION OF THE DRAWINGS

FIGS. 5(A) through 5(E') show cross-sectional views illustrating another method of manufacturing the semiconductor device of this invention.

DESCRIPTION

Figure 1A:
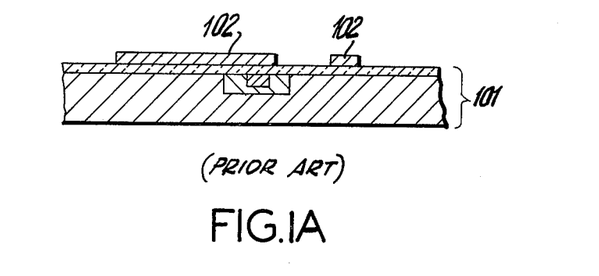
FIGS. 1(A) through 1(D) show cross-sectional views of the conventional prior art semiconductor device illustrated in the order of the steps of the manufacturing process.
Figure 1B:
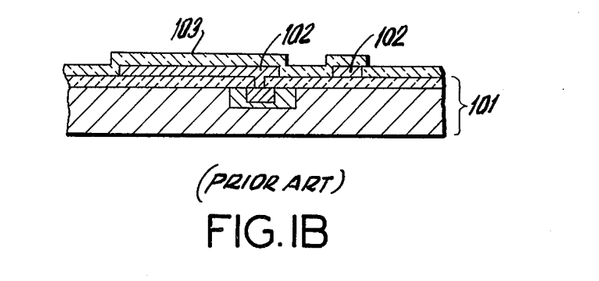

Referring to FIGS. 1(A) through 1(D), a conventional prior art semiconductor device with multi-level interconnection structure is shown with metal channels 102 formed on a planar type semiconductor substrate 101 through a selective etching process (FIG. 1(A)). An insulator film 103 is applied uniformly over the substrate and the metal channels 102 (FIG. 1(B)). Although the plane of the semiconductor substrate shown is flat, it is clear from FIG. 1B that the surface of the substrate (i.e. the surface of the oxide and other insulative film formed on the semiconductor) is uneven due to the selective photoetching process employed to form the metallic channels 102. As a result the subsequent process steps to be described hereunder become difficult to perform causing a reduction in the reliability of the metallic channels.

Figure 1C:
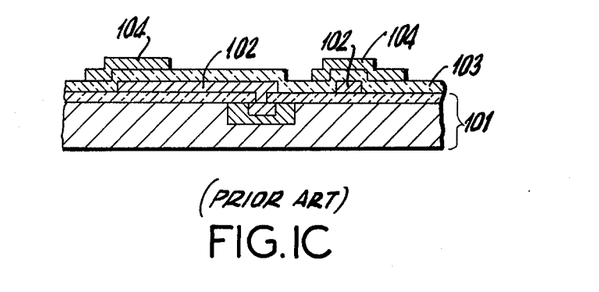
Figure 1D:
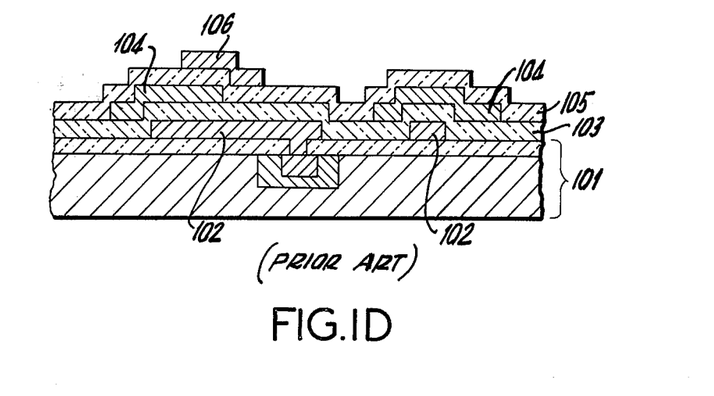

Referring further to FIG. 1, it will be noted that the prior art semi-conductor device with a multi-level interconnection structure is produced by first covering the surface of the above-mentioned metallic channels 102 with the insulator film 103. the second layer of metal is then deposited on the insulator film 103 and selectively etched away to provide the second-level metallic channels 104 (FIG. 1(C). In the same manner, another insulator film 105 and a metal film is deposited. Through the selective photo-etching of the last-mentioned metal film a third-level metallic channel 106 is formed on the insulator film 105 as shown in FIG. 1(D). In this structure, it may be observed that any unevenness of the metal and insulator layers is accumulated toward the surface of the higher level layers.

It has been the practice to form the metal film on the surface of the substrate by resorting to vacuum evaporation of sputtering metal particles. These processes produce vertical portions of the deposited metallic layer which are thinner and less adherent than horizontal portions parallel to the substrate surface. Furthermore, the photo resist substance for selective etching when applied on this metallic layer by rollers, is subjected to a centrifugal force causing the substance to thin out on the outward sides of the "hills" of the metallic layer in relation to the coating on the rest of the underlying layer. Accordingly, when metallic channels are provided on a substrate having an appreciably uneven surface, they are more easily etched into the vertical portions than the portions parallel to the surface of the basic semiconductor substrate. As a result, semiconductor devices manufactured by the foregoing process are difficult to fabricate uniformly thus making it practically impossible to produce reliable multi-level wiring layers of the type described above.

Figure 2A:
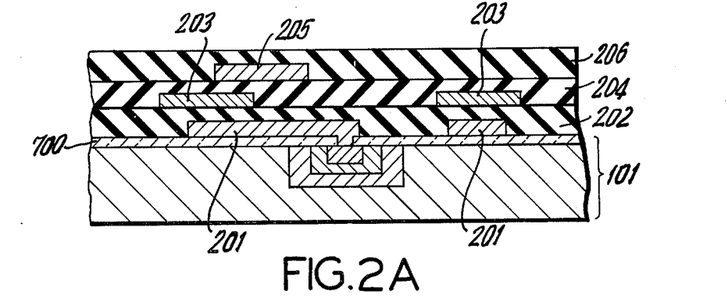
FIGS. 2(A) and 2(B) respectively show cross-sectional views of a first embodiment of this invention and a modification.

Referring to FIG. 2 which shows a preferred embodiment of the present invention, the semiconductor device comprises a semiconductor substrate 101 which comprises of a base substrate of silicon having the necessary number of circuit elements and an insulator film of silicon dioxide 700 formed over the base substrate. This structure of the substrate 101 may be quite similar to the conventional semiconductor device illustrated in FIG. 1. On the surface of the substrate 101, first layer channels 201 are formed from aluminum and covered with a first insulator film 202 of alumina. The channels 201 are formed by selectively anodic oxidizing an aluminum sheet to form the alumina film 202. The film 202 formed in this way has a substantially flat surface parallel to the surface of the substrate 101. The channels 201 serve as electrodes for circuit elements or mutually interconnect the electrode region of the circuit elements. Conducting channels 203 and 205 together with insulating films 204 and 206 are formed in like manner on the substantially flat surface of film 202. A step-by-step explanation of the process of forming the above-mentioned films and layers will be given later in reference to FIG. 4.

As will be apparent from the foregoing, each of the wiring layers is formed on each of the underlying wiring layers covered with alumina film. Each of the underlying layers is flat so that the overlying layer is easily formed thereon. Moreover, since the underlying wiring layers are formed by the selective anodization of a aluminum film and not by the photo-etching process, this structure is capable of maintaining the flatness of the underlying surface. It follows, therefore, that all the defects attributable to the problem of unevenness involved in the prior art structures can be obviated.

This embodiment can also be realized by using other metals in place of aluminum, such as titanium, and others tantalum, suited for anode oxidation.

Figure 2B:
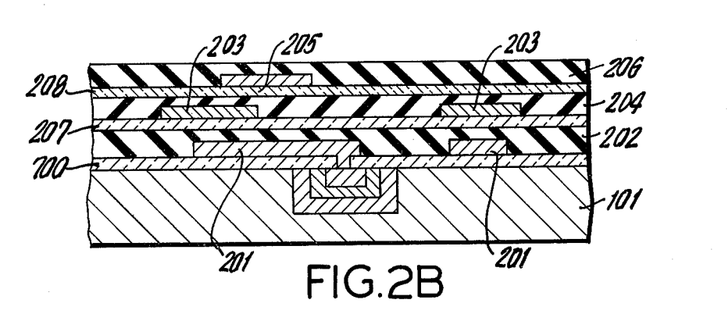

FIG. 2(B) shows a semiconductor device in which silicon dioxide films 207 and 208 are interposed between two of the wiring layers. The silicon dioxide films 207 and 208 are formed by a vapor growth or sputtering process, with a view to reducing the capacitance between the aluminum channels 201 and 203 in each wiring layer. In this embodiment, the silicon dioxide films may be replaced by other insulating materials such as ceramics, glass and metal oxides deposited by the vapor evaporation or sputtering processes.

Figure 3A:
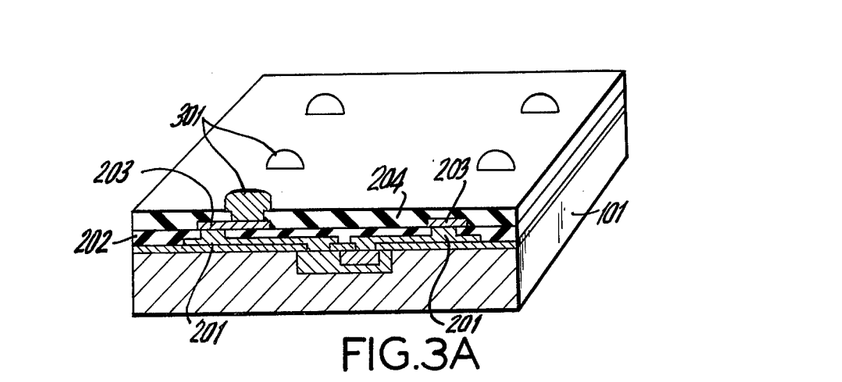
FIGS. 3(A) and 3(B) respectively show a perspective and a cross-sectional view of another embodiment of the invention.

Referring to FIG. 3(A), which illustrates another embodiment of the invention, the semiconductor device has on the substrate 101, first and second wiring layers formed in the above-described manner. The wiring layers comprise of a first layer of aluminum channels 201, an alumina film 202, a second layer of aluminum channels 203, and another alumina film 204. On the upper wiring layer of this embodiment, there is provided a plurality of protruding electrodes 301 which connect the desired portions of upper channels 203 through openings formed in the alumina film 204. The protruding electrodes 301 are formed through a technique well known in the flip-chip semiconductor art, in which solder balls, electroplated bumps or beam leads are employed as the electrode to the outer circuit.

Figure 3B:
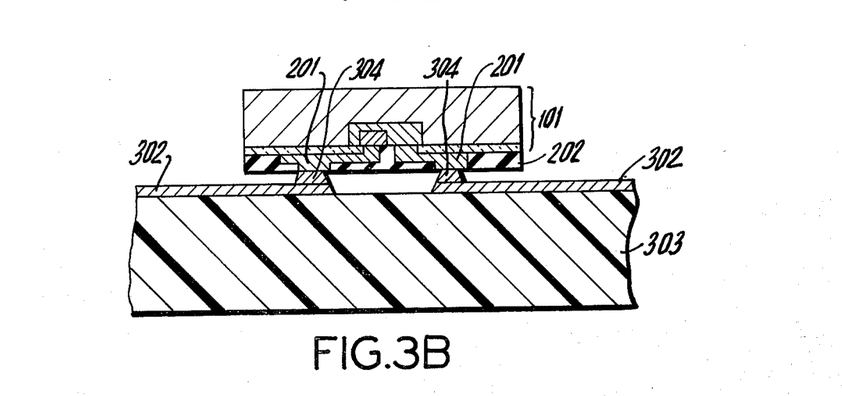

FIG. 3(B) shows a semiconductor device having a flip-chip type semiconductor die similar to that of FIG. 3(A) attached to the leads 302 adherent to the surface of the ceramic substrate 303. At the bonding portion, the inside edges of the leads 302 have protrusions 304. These protrusions 304 are firmly attached to the exposed surfaces of the channels 201 of the semiconductor die. The semiconductor die of the embodiment has the structure illustrated in FIG. 3(B). More particularly, the die has a substantially flat surface coated with insulated film formed through the anode oxidation process. This semiconductor device using face-bonded structure is characterized by ease of manufacture with a high degree of reliability maintained.

Referring to FIGS. 4(A) to (F) which show a preferred method of manufacturing the semiconductor device of the present invention in the order of the processing steps. the method involves a series of selective anodization steps, as described hereunder. In the first step, semiconductor substrate 101 with circuit elements yet to be processed for internal and external connections is uniformly covered with a 1-micron-thick aluminum film 401 deposited by the vacuum evaporation process (FIG. 4(A)). The surface of aluminum film 401 is covered with a photo resist layer 402 (FIG. 4(B)) at those portions other than the portion at which the wiring layer is to be formed. Using the photo resist 402 as a mask, the semiconductor substrate 101 with aluminum film 401 deposited on it, is connected to a positive electrode, the anode forming solution is maintained at a negative potential, and anodic oxidation is carried out. Alternatively, the semiconductor substrate and the aluminum film 401 may be connected to the positive electrode to carry out anodic oxidation. Thus, the exposed surface of aluminum film 401 is selectively covered by a non-porous alumina layer 403 (FIG. 4(C)). It should be noted that the non-porous alumina layer is formed by constant-voltage anodization with ammonium-borate saturated ethylene glycol solution employed as the anodizing agent. In this process, the voltage applied is 40 to 45 volts and the processing time is about 3 minutes. If the voltage is too high or if the processing time is too long, the photo resist loses its adherence to the aluminum surface especially at the peripheries of the photo-resist film.

Figure 4A:
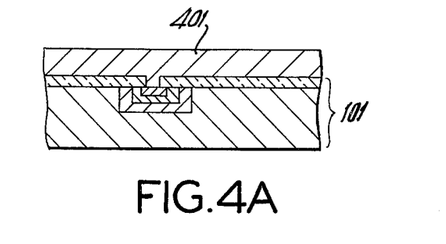
FIGS. 4(A) through 4(F) show cross-sectional views illustrating the method of manufacturing the semiconductor device of this invention.
Figure 4B:
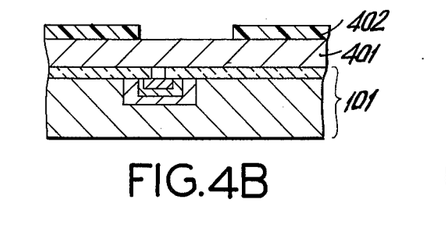
Figure 4C:
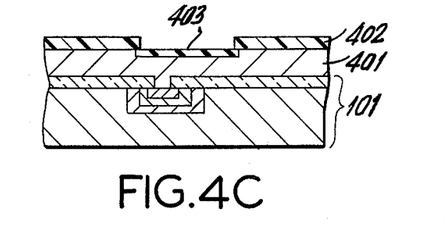
Figure 4D:
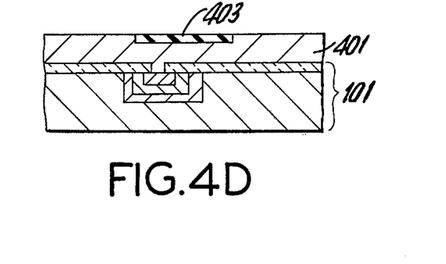
Figure 4E:
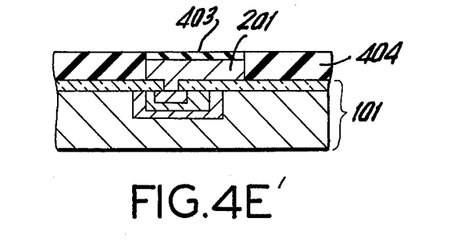

After the non-porous anode-oxidized layer 403 is formed, the photo resist 402 is removed from the aluminum surface by a suitable removing agent (FIG. 4(D)). The selectively formed non-porous alumina layer serves as a mask against further anodization when the unmasked aluminum film 401 is changed to porous alumina 404 (FIG. 4(E)). Upon completion of this step, the insulator film formed of non-porous alumina layer 403 and porous alumina 404 and an aluminum channel 201 covered with alumina form the wiring layer. The solution for converting aluminum into porous alumina may be 2–5% sulfuric acid applied to the aluminum at the temperature of 20° C and the formation is performed at a constant voltage 20 volts.

Figure 4F:
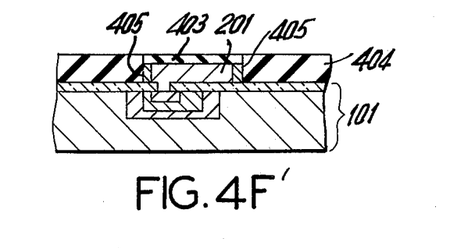

Finally, by repeating the above-mentioned anodization process non-porous alumina 405 is formed on both sides of the aluminum channel 201, for stabilizing the chemical and electrical properties of the wiring layer (FIG. 4(F)). The anodic oxidation in this final stage of processing begins with constant-current generation using the semiconductor substrate as the anode. When the voltage reaches the level of 100 to 150 volts, the operation is to constant-voltage for a period of between 30 and 60 minutes. By this treatment, non-porous alumina 405 is formed on both sides of the aluminum channel 201 and causes the thickness of the non-porous alumina film 403 initially formed on the surface of the channel 201 is thus slightly increased to approximately 0.1 to 0.3 micron. In addition, this treatment results in the aluminum partially left in the course of forming porous alumina to be almost completely changed to alumina.

As has been described above, the aluminum film deposited on the substrate by evaporation or sputtering can be easily selectively anodized to form the insulating alumina film. The surface of the alumina film thus obtained is completely flat and facilitates subsequent processing steps.

The formation of the multi-level interconnection may be completed by providing openings in portions of the non-porous alumina so that the channels can be electrically connected to channels in the overlying layer, after which the above-described anodizing process may be carried out. In order to form openings in the non-porous alumina, an etching solution prepared by diluting a mixture of 35 g. chromic acid anhydride and 20 cc. phosphoric acid with 1 liter of water is applied to the desired locations at 70° to 75° C.

Since non-porous alumina is unaffected by the processing agent for porous alumina, aluminum film is unfailingly changed to the porous alumina through this process. In addition, the forming process can be easily controlled through the regulation of the forming voltage or forming current.

Figure 5A:
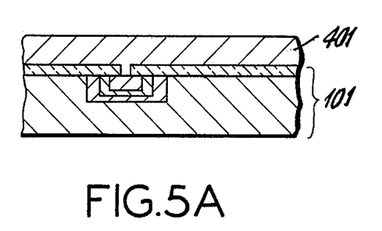
Figure 5B:
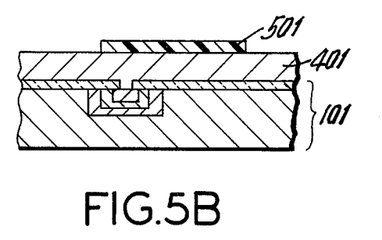

Referring to FIGS. 5(A) through (E'), another preferred method of fabricating the semiconductor device in accordance with the present invention is illustrated.

Figure 5C:
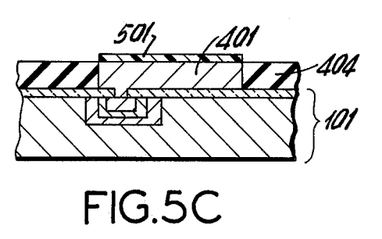

This method comprises steps similar to those of FIG. 4A thin film of aluminum 401 is first deposited on the surface of semiconductor substrate 101 (FIG. 5(A)). A photo resist substance 501 is then applied to partially cover the aluminum film 401 where the aluminum channels are to be formed (FIG.5(B)). The portion of aluminum film 401 where the photo resist substance is not present is anodized then to form porous alumina 404. (FIG. 5(C)). The photo resist 501 is then removed. Next, a uniform non-porous alumina 502 is formed covering an aluminum channel 201 therein (FIG. 5(D)). Thereafter, the non-porous alumina is selectively removed from above the desired portion 503 of channel 201. The portion 503 is an opening either for a connection with a metallic channel in the overlying layer or for an external lead-out electrode (FIG. 5(E)). When it is desired to expose a part of the channel 201 on the same plane as the surface of the alumina film for facilitating the lead-out to external electrodes, the process of forming porous alumina 404 as indicated in FIG. 5(C), is performed and then followed by the provision of a mask 504 of photo resist substance adherent to the electrode lead-out portion on the surface of the aluminum film 401 (FIG. 5(D')). Then, the non-porous alumina film 505 is formed. In this process, the mask 504 may be acid proof metal or alloy as well as photo resist substance.

Figure 5D:
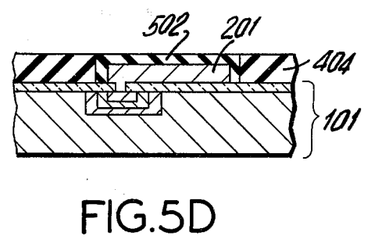
Figure 5E:
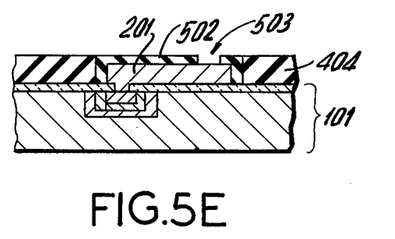

In the embodiment just described described, the porous alumina 404 and non-porous alumina 502 are formed under the same conditions as in the formation of the porous alumina 404 and non-porous alumina 405 as has been already explained in connection with the first manufacturing method.

As will be seen from the foregoing, the wiring layer comprising of the metallic channels and insulating film formed through the above-described process can be flattened irrespective of how many such wiring layers are laminated to form the multi-level interconnection structure. Although some change in volume is possible in converting aluminum into alumina, any unevenness attributable to this change in volume is negligible compared with that involved in the prior art device shown in FIG. 1. It may be noted that even if the change in volume causes some unevenness over the surface of the anodic oxidation film, it does not adversely affect the flattened formation of the overlying wiring layer, because the boundary gradient between the wiring and the alumina is extremely gradual. Moreover, the semiconductor device of this invention withstands scratching and deposition of foreign matters on the wiring layer, because the wiring elements are protected by solid alumina.

In conventional semiconductor devices having aluminum channels, the alloying action observed in the course of heat treatment after the formation of the channel may lead to the recrystalization of aluminum to form tiny protrusions on the surface of the aluminum wiring channels or cracks in the insulator film deposited on the channels. According to the instant invention, the aluminum channels are almost entirely buried in the alumina layer so that the channels show no tendency to deteriorate. Cracks do not form in the alumina film.

Figure 6:
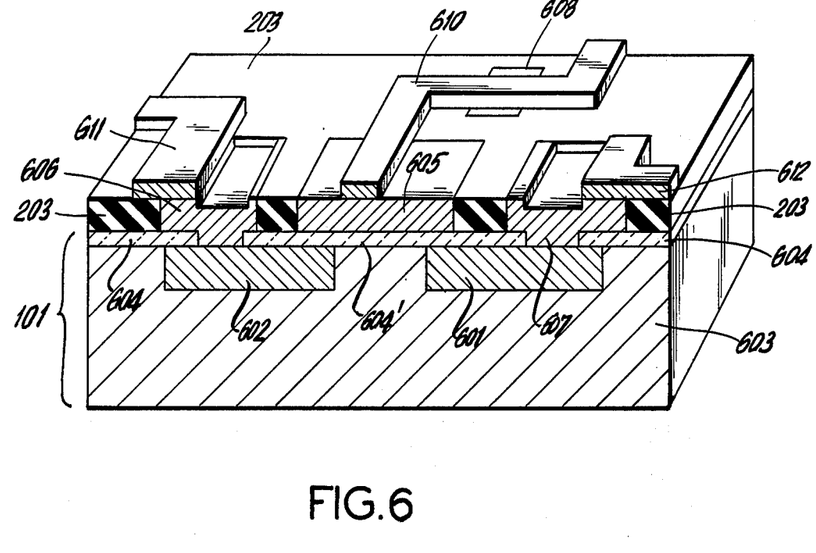
FIG. 6 shows a perspective view of still another embodiment of this invention.

Referring to FIG. 6 a field effect transistor 60, which is still another embodiment of the present invention, has a semiconductor substrate 101 so fabricated that drain and source regions 601 and 602 of n-type conductivity are formed in a p-type silicon substrate 603 in the same way as in conventional prior art devices. An insulating film adherent to the surface, which had been used as a mask for selective impurity diffusion, is then completely removed to expose the whole surface of the semiconductor substrate 603. Next, a thin film of silicon dioxide 604, about 0.25 micron thick, is uniformly deposited on the substrate surface. The film 604 covers the entire surface of the substrate 603 with the exception of the electrode openings for the drain and source regions, 601 and 602. The film portion 604' of the deposited film 604 between the drain and source of the field effect transistor serves as a gate film insulator. Thereafter, on the top surface of the semiconductor substrate 101, an aluminum film of uniform thickness of, about 1 micron, is deposited by vacuum evaporation. On each of the top portions where the gate, drain and source electrodes 605, 606 and 607 are to be formed, a photo resist film is applied. The aluminum film and the semiconductor substrate 101 are then anodized in dilute sulfuric acid with a concentration of 2% at a temperature of 20° C. The voltage for this purpose a constant is 20 volts. On completion of this anodizing step, the aluminum layer which had been covered by the photo resist substance is converted into a first wiring layer composed of the gate electrode 605; drain electrode 606; source electrode 607; an electrode 608 of another circuit element; and an alumina insulator film 203 which surrounds those electrodes. In this embodiment, channels 610, 611 and 612 for the second channel layer are subsequently formed in the usual manner to provide interconnection for the respective circuit elements.

As will be seen from the description of the drawings, etching is not used in forming the electrodes 605, 606, 607, and 608. Note that the lowermost layer 604 of the insulating films is thin compared with those on the substrate. The thickness of the layer 604 may be about one third of the aluminum film 605. The electrodes thus obtained are, therefore, highly reliable.

Also, the overlying channel layers 610, 611, and 612 can be readily formed, because the surface of the first wiring layer is flat, smooth, and substantially parallel to the surface of the substrate 101. Thus interconnection reliability is enhanced.

This embodiment permits the use of different materials for the two groups of electrodes, i.e., the underlying layer electrodes 605, 606, 607 and 608 and the overlying layer electrodes 610, 611 and 612, with a view to facilitating the formation of the overlying interconnection. In addition, the overlying layer channels can be formed by anodic oxidation like those of the underlying layer. By so doing, the reliability of the overlying layer against mechanical shock such as scratching of the upper layer channels is improved.

While the foregoing description has been made in conjunction with semiconductor devices having at least one wiring layer comprising aluminum channels and alumina formed through the selective anodic oxidation of aluminum sheet, it is to be understood that the objects of the present invention can be also attained by substituting for aluminum with titanium, tantalum, niobium or other anodizable metal or material having the needed electrical characteristic, i.e. that it can be changed from conductive to insulative or vice versa by oxidation, nitriding, reduction or other chemical reaction.

The principal advantage of the present invention is summarized as follows. Since wiring layers are formed through the anodization and not through photo-etching, each of the wiring layers are relatively flat irrespective of how many layers are laminated on the substrate. This is in sharp contrast to the conventional device wherein unevenness is unavoidable in the multi-layered interconnection structure. Note that semi-conductor devices to which the wiring layers as above described are applicable are not restricted to plane semiconductor substrate coated with silicon dioxide, it for example may be a mesa type device coated with insulator film. Also not that the silicon dioxide film adherent to the semiconductor base substrate may be coated with other insulator films, such as silicon nitride phosphosilicate glass, alumina-silicate glass, alumina formed by evaporation, sputtering or vapor growth process. Moreover, it is possible to further improve the stability of the characteristics of the semiconductor device through thermal treatment in water vapor heated up to about 400° C. Also, it is possible to facilitate process control and quality checking of the completed device by way of differentiating wiring layers with colorants of insulative material, e.g., manganese oxide, cobalt oxide, copper oxide, iron oxide, and chromium oxide.

It will be apparent to those skilled in the art that further modifications of the embodiment are possible without departing from the scope and spirit of the invention. It is, therefore, to be understood that the foregoing description is made by way of example and not as a limitation to the scope of the invention as defined in the appended claims.

What is claimed is:

1. A semiconductor structure comprising, in combination, a silicon semiconductor substrate having a planar silicon dioxide layer located on a surface of said substrate; an anodized aluminum oxide layer having a planar top surface and a bottom surface in contact with said silicon dioxide layer; a first aluminum layer having portions thereof in contact with portions of said substrate and extending upwardly from the substrate surface through said silicon dioxide layer and into said aluminum oxide layer, said first aluminum layer having a top surface which is below the planar top surface of said aluminum oxide layer; a first protective insulating layer having a bottom surface in contact with said planar top surface of said aluminum oxide layer; a second aluminum layer having at least one portion in contact with said first aluminum layer and having a planar bottom surface portion in contact with said planar top surface of said first protective insulating layer; a second anodized aluminum oxide layer in contact with said second aluminum layer and said first protective insulating layer; and a second protective insulating layer located on said second aluminum layer and said second anodized aluminum oxide layer.

2. A semiconductor device comprising a semiconductor substrate having a planar insulating layer located on a surface of said substrate; an oxide layer formed of the oxide of an anodizable material and having a planar top surface and a bottom surface in contact with said insulating layer; and a conductive layer comprised of said anodizable material and having a portion thereof in contact with a portion of said substrate and extending upwardly from the substrate surface through said insulating layer and into said oxide layer, said conductive layer having a top surface which is below the planar top surface of said oxide layer.

3. The semiconductor device claimed in claim 2, in which a portion of the top surface of said conductive layer in exposed.

4. The semiconductor device claimed in claim 2, in which said anodizable material is selected from the group consisting of aluminum, tantalum, titanium, niobium, and hafnium.

5. The semiconductor device claimed in claim 2, in which said anodizable material is aluminum.

6. The semiconductor device claimed in claim 5, in which said oxide layer comprises a portion in contact with said conductive layer, said portion of said oxide layer being nonporous aluminum oxide.

7. The semiconductor device claimed in claim 6, in which the remaining portion of said oxide layer is porous aluminum oxide.

8. A semiconductor device comprising a semiconductor substrate having a planar insulating layer located on a surface of said substrate; an oxide layer comprised of the oxide of an anodizable material and having a planar top surface and a bottom surface in contact with said insulating layer; and a conductive layer comprised of said anodizable material and having a portion thereof in contact with a portion of said substrate and extending upwardly from the substrate surface through said insulating layer and into said oxide layer, a portion of the top surface of said conductive layer being substantially flush with the planar top surface of said oxide layer, the remaining portion of the top surface of said conductive layer being below the planar top surface of said oxide layer.

9. A semiconductor device comprising a semiconductor substrate having a planar insulating layer located on a surface of said substrate; an oxide layer comprised of the oxide of an anodizable material and having a planar top surface and a bottom surface in contact with said insulating layer; a first conductive layer comprised of said anodizable material and having a portion thereof in contact with a portion of said substrate, said first conductive layer extending upwardly from the substrate surface through said insulating layer and into said oxide layer, said conductive layer having a top surface which is below the planar top surface of said oxide layer; and a second conductive layer having a portion in contact with said first conductive layer and having a planar bottom surface portion in contact with said planar top surface of said oxide layer.

10. A semiconductor device comprising a semiconductor substrate having a first planar insulating layer located on a surface of said substrate; an oxide layer comprised of the oxide of an anodizable material and having a planar top surface and a bottom surface in contact with said first insulating layer; a first conductive layer comprised of said anodizable material and having a portion in contact with said surface of said substrate, said first conductive layer extending upwardly from the substrate surface through said first insulating layer and into said oxide layer, said conductive layer having a top surface portion which is below the planar top surface of said oxide layer; a second insulating layer having a bottom surface in contact with said planar top surface of said oxide layer; and a second conductive layer having a portion in contact with said first conductive layer and having a bottom surface portion in contact with the top surface of said second insulating layer.

11. A flip-chip semiconductor device comprising a semiconductor substrate having a planar insulating layer located on a surface of said substrate; an oxide layer of the oxide of an anodizable material having a planar top surface and a bottom surface in contact with said insulating layer; a conductive layer of said anodizable material having a portion in contact with said substrate surface and extending upwardly from the substrate surface through said insulating layer and into said oxide layer; and a protruding electrode in contact with said conductive layer.

12. A flip-chip semiconductor device comprising a semiconductor substrate having a first planar insulating layer located on a surface of said substrate; an oxide layer of the oxide of an anodizable material having a planar top surface and a bottom surface in contact with said first insulating layer; a conductive layer of said anodizable material having a portion in contact with said substrate surface and extending upwardly from said substrate surface through said first insulating layer and into said oxide layer, said conductive layer having a top surface portion which is below the planar top surface of said oxide layer; a second insulating layer having a bottom surface in contact with said planar top surface of said oxide layer; and an electrode protruding from the top surface of said second insulating layer and electrically connected to said conductive layer.

13. A field effect transistor comprising a semiconductor substrate having therein source and drain regions and having an insulating layer located on a surface of said substrate, said insulating layer including a gate insulator located at least between said source and drain regions; an oxide layer of the oxide of anodizable material having a bottom surface in contact with said insulating layer; a gate electrode of said anodizable material having a bottom surface in contact with said gate insulator and extending upwardly into said oxide layer; a source electrode of said anodizable material having a portion in contact with said source region and extending upwardly from the surface of said source region through said insulating layer and into said oxide layer; and a drain electrode of said anodizable material having a portion in contact with said drain region and extending upwardly from the surface of said drain region through said insulating layer and into said oxide layer.

* * * * *